(12) United States Patent
Choi

(10) Patent No.: US 7,733,708 B2
(45) Date of Patent: Jun. 8, 2010

(54) SEMICONDUCTOR MEMORY DEVICE, MEMORY SYSTEM HAVING THE SAME, AND SWING WIDTH CONTROL METHOD THEREOF

(75) Inventor: Jung-Hwan Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 827 days.

(21) Appl. No.: 11/648,606

(22) Filed: Jan. 3, 2007

(65) Prior Publication Data
US 2007/0153591 A1 Jul. 5, 2007

(30) Foreign Application Priority Data
Jan. 3, 2006 (KR) .................... 10-2006-0000641

(51) Int. Cl.
*G11C 7/00* (2006.01)
(52) U.S. Cl. .................. 365/189.05; 365/191; 365/206; 365/185.09
(58) Field of Classification Search ............ 365/189.05, 365/191, 206, 185.09
See application file for complete search history.

(56) References Cited
U.S. PATENT DOCUMENTS

| | | | |
|---|---|---|---|
| 6,166,971 A | 12/2000 | Tamura | |
| 6,930,941 B2 * | 8/2005 | Nakase | ........................ 365/205 |
| 7,019,556 B2 | 3/2006 | Yoo | |
| 7,224,606 B2 * | 5/2007 | Yamamoto | ............. 365/185.11 |
| 7,259,592 B2 * | 8/2007 | Lee et al. | ........................ 326/83 |
| 7,423,920 B2 * | 9/2008 | Koo | ........................... 365/194 |
| 7,523,380 B1 * | 4/2009 | Trimberger | ................. 714/763 |
| 2003/0223303 A1 | 12/2003 | Lamb et al. | |
| 2005/0057981 A1 | 3/2005 | Yoo | |

FOREIGN PATENT DOCUMENTS

| | | |
|---|---|---|
| DE | 10 2004 032 690 | 3/2005 |
| JP | 2001-007693 | 1/2001 |
| KR | 1020030032178 A | 4/2003 |
| KR | 10-2005-0098743 | 10/2005 |

OTHER PUBLICATIONS

German Office Action dated Mar. 6, 2009 for Corresponding German Application No. 10-2007-001454.8-55.
Office Action for Corresponding Korean Application No. 10-2006-0000641 dated Jul. 27, 2007.

* cited by examiner

*Primary Examiner*—Connie C Yoha
(74) *Attorney, Agent, or Firm*—Harness, Dickey & Pierce, P.L.C.

(57) ABSTRACT

A semiconductor memory device that may include output drivers, each of which varies a data swing width in response to a correction code, and one or more data swing width control portions. Each of the data swing width control portions may correspond to an output driver, may vary the correction code according to a data swing width of the corresponding output driver to change the data swing width to a correction swing width, and then varies the correction code again to the extent that data of the corresponding output driver are normally transmitted, which may reduce the data swing width.

25 Claims, 5 Drawing Sheets

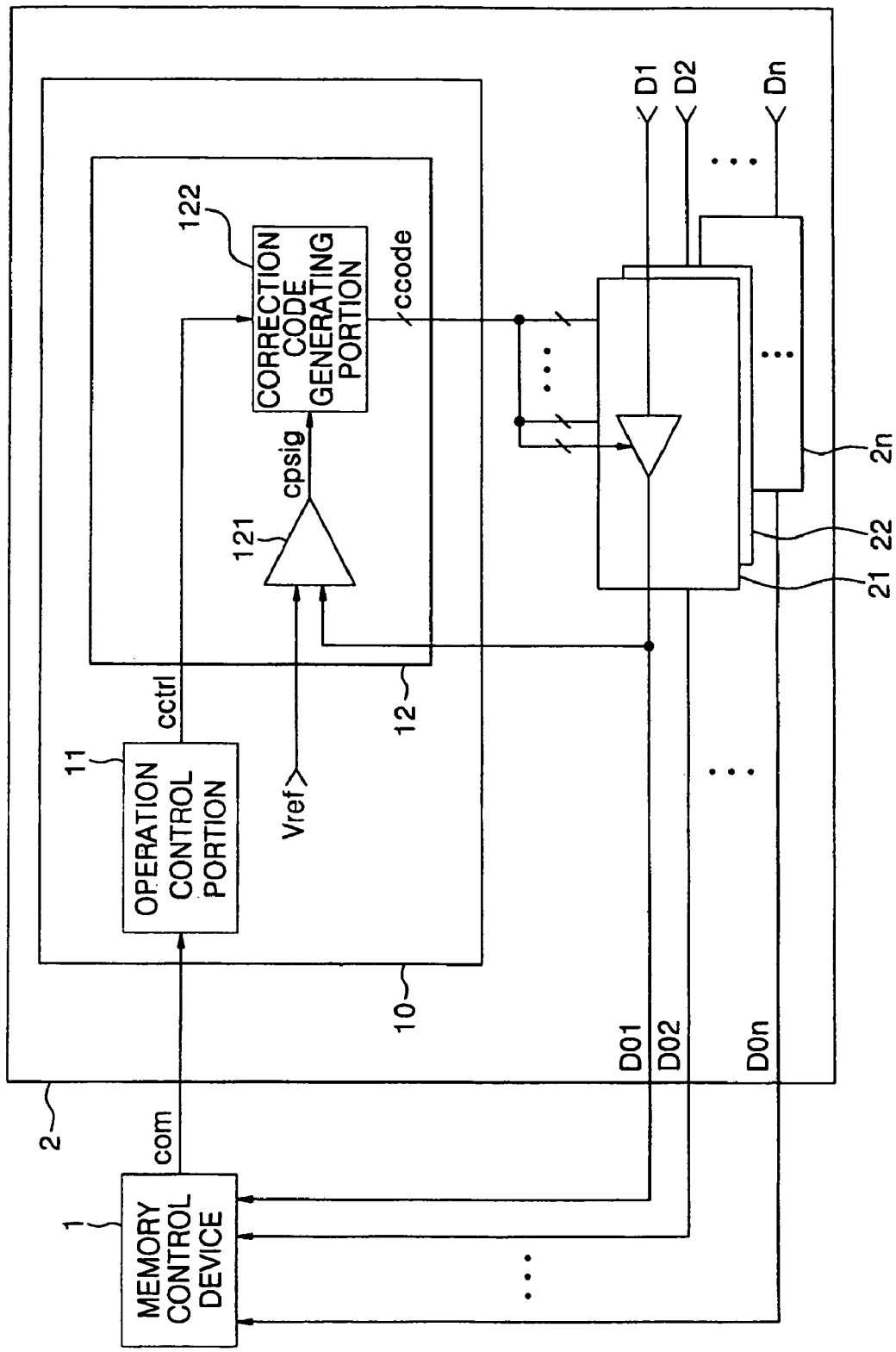
FIG. 1
(CONVENTIONAL)

SEMICONDUCTOR MEMORY DEVICE, MEMORY SYSTEM HAVING THE SAME, AND SWING WIDTH CONTROL METHOD THEREOF

PRIORITY STATEMENT

This application claims the benefit of priority to Korean Patent Application No. 2006-0000641, filed Jan. 3, 2006, the entire contents of which are incorporated herein by reference.

BACKGROUND OF THE INVENTION

1. Field of the Invention

Example embodiments of the present invention relate to a semiconductor memory device and, more particularly, to a semiconductor memory device which can control a data swing width of an output buffer, a memory system having the same, and a swing width control method thereof.

2. Description of the Related Art

A semiconductor memory device such as a DRAM, for example, should have a definite swing width of data transmitted through a wire line on a PCB substrate on which the semiconductor memory device may be mounted. For example, if a semiconductor memory device is mounted on a memory module, for example, a single in-line memory module (SIMM) or a double in-line memory module (DIMM), the swing width of a signal transmitted through a wire line above the PCB substrate should be in a range of 800 mV at 1.0 volt to 1.8 volt.

A conventional semiconductor memory device, as shown in FIG. 1, may include a data swing width controller to correct the swing width of an output data signal to maintain a desired and/or definite level. The data swing width controller may correct the swing width of the data so that the semiconductor memory device may perform a stable operation under poor operating conditions.

Referring to FIG. 1, a memory system may include a memory control device 1 and a semiconductor memory device 2. The semiconductor memory device 2 may include a single data swing width controller 10 and a plurality of output drivers 21 to 2n. The data swing width controller 10 may include an operation control portion 11 and a swing width correcting portion 12 and may substantially simultaneously correct the data swing widths of the plurality of output drivers 21 to 2n.

Functions of the components of the conventional semiconductor memory device illustrated in FIG. 1 are explained below.

The memory control device 1 may be arranged outside the semiconductor memory device 2 and may control an operation of the semiconductor memory device 2 like a chip set. The memory control device 1 may generate a command com to request a swing width correcting operation and may apply the command com to the semiconductor memory device 2 during a data swing width control operation.

The data swing width controller 10 of the semiconductor memory device 2 may correct the data swing widths of the plurality of output drivers 21 to 2n to match the correction swing width cswing.

For example, the data swing width controller 10 may include an operation control portion 11 and a swing width correcting portion 12. The operation control portion 11 may receive the command com from the memory control device 1 to enable a swing width correcting signal cctrl causing the swing width correcting portion 12 to perform the swing width correcting operation.

The swing width correcting portion 12 may include a comparator 121 and a correct code generator 122. The comparator 121 may receive data D01 from an output driver 21, compare a voltage level of the data D01 to a reference voltage Vref and generate a comparison signal cpsig. The correction code generating portion 122 may vary a code value of a correction code ccode according to the comparison signal cpsig to cause the data swing widths of all of the plurality of output drivers 21 to 2n to become equal to the correction swing width cswing.

The reference voltage Vref may be an average voltage value of a maximum voltage and a minimum voltage of the correction swing width cswing and may have a voltage value for determining the size of the correction swing width cswing.

Each of a plurality of output drivers 21 to 2n may vary the data swing width to be equal to the correction swing width cswing in response to the correction swing code ccode transmitted from the data swing width controller 10 during the swing width correcting operation. Among the plurality of output drivers 21 to 2n, one output driver 21 may transmit the data D01 having a varied swing width to the comparator 121 in the swing width correcting portion 12 so that the data swing width controller 10 is aware of the size of the varied data swing width. A conventional technique of varying the data swing width in response to a predetermined-bit digital code, for example, the correction code ccode, is well known, and thus, a detail description of the conventional technique is omitted herein for the sake of brevity.

An example operation of the conventional memory system of FIG. 1 is explained below.

In this example operation, if the memory control device 1 generates the command com to request the swing width correction operation, the operation control portion 11 enables the swing width correcting signal cctrl causing the swing width correcting portion 12 to perform the swing width correcting operation.

Accordingly, if the data swing width of the reference output driver 21 is smaller than the correction swing width cswing so that the voltage level of the data D01 is higher than the reference voltage Vref, the comparator 121 of the swing width correcting portion 12 generates a comparison signal cpsig having a high level. The correction code generating portion 122 may increase (or decrease) the code value of the correction code ccode by one interval or step, for example, in response to the comparison signal cpsig. Accordingly, all of the plurality of output drivers 21 to 2n increase or decrease the data swing width by a desired and/or predetermined width in response to the correction code ccode.

The comparator 121 and the correction code generating portion 122 may perform the above operation repetitively until the voltage level of the data D01 is equal to the reference voltage Vref, thereby indicating that the data swing widths of all of the plurality of output drivers 21 to 2n are equal to the correction swing width cswing.

Conversely, if the data swing width of the reference output driver 21 is higher than the correction swing width cswing so that the voltage level of the data D01 is lower than the reference voltage Vref, the comparator 121 and the correction code generating 122 may reduce (or increase) the code value of the correction code ccode step by step, for example, to cause the voltage level of the data D01 to be equal to the reference voltage Vref. That is, the data swing widths of all of the plurality of output drivers 21 to 2n become equal to the correction swing width cswing.

As described above, the conventional semiconductor memory device 2 substantially simultaneously corrects the data swing widths of all of the plurality of output drivers 21 to 2n to the correction swing width.

However, the correction swing width is generally directed towards satisfying the worst possible operation condition of the semiconductor memory device and thus, there is a problem because the data swing width may be excessively increased under a normal operation condition.

That is, the conventional data swing width controller may excessively increase the data swing widths of the plurality of output drivers 21 to 2n without considering the operation environment of the semiconductor memory device and the memory system, thereby increasing power consumption of the conventional semiconductor memory device.

Further, if data D01 to D0n output through the plurality of output drivers 21 to 2n are transmitted in the same direction, a simultaneous switching noise (SSN) phenomenon may occur due to the excessively increased data swing width and thus, the whole operation performance of the memory system may deteriorate. The SSN represents a noise which may occur when a plurality of data is transmitted in the same direction through adjacent signal lines and an electric current of data flows excessively.

Still Further, the conventional semiconductor memory device controls the swing widths of all of the output drivers 21 to 2n using the data swing width of the reference output driver 21. Thus, if the reference output driver 21 has the wrong data swing width, the rest of the output drivers 21 to 2n will also have the wrong data swing width. That is, a problem may occur in the conventional semiconductor device because the entire performance of the memory system depends on the data swing width of the reference output driver 21.

SUMMARY OF THE INVENTION

Example embodiments of the present invention provide a semiconductor memory device, a memory system having the same and a swing width control method thereof which considers the operation environment of the semiconductor memory device and the memory system to vary the data swing width of the semiconductor memory device, thereby reducing the power consumption and improving the operation performance of the memory system.

An example embodiment of the present invention provides a semiconductor memory device. The semiconductor memory device may include a plurality of output drivers and at least one data swing width control portion. Each of the plurality of output drivers may vary a data swing width in response to a correction code. The at least one data swing width control portion may vary a correction code according to a data swing width of at least one output driver of the plurality of output drivers to change the data swing width to a correction swing width and may vary the correction code again to the extent that data of the corresponding output driver are normally transmitted to thereby reduce the data swing width.

An example embodiment of the present invention provides a semiconductor memory device. The semiconductor memory device may include a plurality of output drivers each of which varies a data swing width in response to a correction code; and a plurality of data swing width control portions which correspond to at least one output driver, vary the correction code according to a data swing width of the corresponding output driver to change the data swing width to a correction swing width, and then vary the correction code again to the extent that data of the corresponding output driver are normally transmitted to thereby reduce the data swing width.

According to an example embodiment of the present invention, each of the plurality of data swing width control portions may include an operation control portion which performs a swing width correction operation and performs a swing width re-correction operation until data of the corresponding output driver are not transmitted or transmitted with errors when the swing width correction operation is completed; a swing width correcting portion which compares the data swing width of the corresponding output driver to the correction swing width and sequentially increases or decreases the correction code according to the comparison result to change the data swing width to the correction swing width during the swing width operation; and a swing width re-correcting portion which varies (e.g., sequentially decreases or increases) the correction code of the swing width correcting portion to decrease the data swing width during the swing width re-correction operation and then varies (e.g., increases or decreases) the correction code again for the data of the corresponding output driver to be normally transmitted to thereby increase the data swing width again when the swing width re-correction operation is completed.

According to an example embodiment of the present invention, the swing width re-correcting portion may include a correction code varying portion which stores the correction code varied by the swing width correcting portion during the swing width correction operation and varies the stored correction code again during the swing width re-correction operation; a margin code generating portion which generates a margin code having a code value for varying the correction code when the swing width re-correction operation is completed; and a re-correction code generating portion which adds the margin code of the margin code generating portion to the correction code of the correction code varying portion and outputs the addition result to the corresponding output driver.

Another example embodiment of the present invention provides a semiconductor memory device. The semiconductor memory device includes a plurality of output drivers each of which varies a data swing width in response to a correction code; and a swing width control portion which selects at least one of the plurality of output drivers according to a driver selecting signal, varies the correction code according to a data swing width of the selected output driver to change the data swing width to a correction swing width, and then varies the correction code again to the extent that data of the selected output driver are normally transmitted to thereby reduce the data swing width.

According to an example embodiment of the present invention, the data swing width control portion may include an operation control portion which performs a swing width correction operation and performs a swing width re-correction operation until data of the selected output driver are not transmitted when the swing width correction operation is completed; a swing width correcting portion which compares the data swing width of the selected output driver to the correction swing width and varies the correction code according to the comparison result to change the data swing width to the correction swing width during the swing width operation; a swing width re-correcting portion which varies the correction code of the swing width correcting portion to decrease the data swing width during the swing width re-correction operation and then varies the correction code again for the data of the selected output driver to be normally transmitted to thereby increase the data swing width again when the swing width re-correction operation is completed; and a correction driver selecting portion which selects one of the plurality of output drivers according to the driver selecting signal and transmits the correction code outputted from the swing width correcting portion or the swing width re-correcting portion to the selected output driver or transmits data outputted from the selected output driver to the swing width correcting portion.

According to an example embodiment of the present invention, the swing width re-correcting portion includes a correction code varying portion which stores the correction code varied by the swing width correcting portion during the swing width correction operation and varies the stored correction code again during the swing width re-correction operation; a margin code generating portion which generates a margin code having a code value for varying the correction code when the swing width re-correction operation is completed; and a re-correction code generating portion which adds the margin code of the margin code generating portion to the correction code of the correction code varying portion and outputs the addition result to the selected output driver.

An example embodiment of the present invention provides a memory system. The memory system includes a control device which generates a first command for requesting a swing width correction operation, generates a second command for requesting a swing width re-correction operation, and detects whether there is an error in input data when the second command is generated to generate a detecting signal; a plurality of output drivers which vary a data swing width in response to correction codes; and a data swing width control portion which varies each of the correction codes to change the data swing width of each of the output drivers to a correction swing width in response to the first command, and varies the correction codes again to the extent that data of each of the output drivers are normally transmitted to thereby reduce the data swing width.

According to an example embodiment of the present invention, a plurality of data swing width control portions are arranged and correspond to the plurality of output drivers, and each of the plurality of data swing width control portions may include an operation control portion which performs a swing width correction operation in response to a first command, performs a swing width re-correction operation in response to a second command, and determines whether the swing width re-correction operation is completed in response to the inputted detecting signal; a swing width correcting portion which compares the data swing width of the corresponding output driver to the correction swing width and varies the correction code according to the comparison result to change the data swing width to the correction swing width during the swing width operation; and a swing width re-correcting portion which varies the correction code of the swing width correcting portion to decrease the data swing width during the swing width re-correction operation and then varies the correction code again for the data of the corresponding output driver to be normally transmitted to thereby increase the data swing width again when the swing width re-correction operation is completed.

According to an example embodiment of the present invention, the data swing width control portion may include an operation control portion which performs a swing width correction operation in response to the first command, performs a swing width re-correction operation in response to the second command, and determines whether the swing width re-correction operation is completed in response to the inputted detecting signal during the swing width re-correction operation; a swing width correcting portion which compares the data swing width of the corresponding output driver to the correction swing width and varies the correction code according to the comparison result to change the data swing width to the correction swing width during the swing width operation; a swing width re-correcting portion which varies the correction code of the swing width correcting portion to decrease the data swing width during the swing width re-correction operation and then varies the correction code again for the data of the corresponding output driver to be normally transmitted to thereby increase the data swing width again when the swing width re-correction operation is completed; and a correction driver selecting portion which selects one of the plurality of output drivers according to a driver selecting signal and transmits the correction code outputted from the swing width correcting portion or the swing width re-correcting portion to the selected output driver or transmits data outputted from the selected output driver to the swing width correcting portion.

An example embodiment of the present invention provides a swing width control method of a semiconductor memory device. The swing width control method includes a swing width correcting operation for comparing a swing width of output data to a correction swing width and varying a correction code according to the comparison result to thereby make the swing width of the output data become equal to the correction swing width; a swing width re-correcting operation for varying the correction code again to the extent that the output data are normally transmitted to reduce the swing width of the output data; and a swing width re-correction completing operation for adding a margin code to the correction code to increase the swing width of the output data a little and then maintaining the increased swing width of the output data when the output data are abnormally transmitted.

According to an example embodiment of the present invention, the swing width re-correcting operation includes obtaining the correction code which is varied in the swing width correcting operation; varying the correction code again to reduce the swing width of the output data and then detecting whether the output data are normally transmitted or not; and reentering the varying operation when the output data are normally transmitted and entering the swing width re-correction completing operation when the output data are abnormally transmitted.

An example embodiment of the present invention provides a semiconductor memory device. The semiconductor memory device may include a plurality of output drivers, each of the plurality of output drivers varying a data swing width in response to a correction code; and at least one data swing width control portion varying the correction code until a data swing width of at least one corresponding output driver of the plurality of output drivers matches a correction swing width, varying the correction code again until the data swing width is smaller than a threshold swing width, adding a margin code to the correction code to create an added code, and supplying the added code to the at least one corresponding output driver.

According to an example embodiment of the present invention, the at least one data swing width control portion may include a swing width correcting portion comparing the data swing width of the at least one corresponding output driver to the correction swing width and varying the correction code to change the data swing width until the data swing width equals the correction swing width; and a swing width re-correction portion further varying the correction code from the swing width correcting portion to decrease the data swing width until the data swing width is smaller than a threshold swing width and adding the correction code to a margin code to increase the data swing width.

According to an example embodiment of the present invention, the threshold swing width is based on the operating conditions and/or operating environment of the semiconductor device.

An example embodiment of the present invention provides a swing width control method. The method may include comparing a swing width of output data to a correction swing width; varying a correction code based on the comparing so the swing width of the output data is equal to the correction swing width; varying the correction code again until the data swing width is smaller than a threshold swing width; and adding a margin code to the correction code to increase the swing width of the output data to a value between the correction swing width and the threshold swing width.

BRIEF DESCRIPTION OF THE DRAWINGS

The above and other features and advantages of the present invention will become more apparent to those of ordinary skill in the art by considering the example embodiments of the present invention described below in connection with the attached drawings in which:

FIG. 1 is a block diagram illustrating a configuration of a conventional memory system;

DETAILED DESCRIPTION OF EXAMPLE EMBODIMENTS OF THE PRESENT INVENTION

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various components, these components should not be limited by these terms. These terms are only used to distinguish one component from another. For example, a first component could be termed a second component, and, similarly, a second component could be termed a first component, without departing from the scope of the present invention. As used herein, the term "and/or" includes any and all combinations of one or more of the associated listed items.

It will also be understood that when a component is referred to as being "connected" or "coupled" to another component, it can be directly connected or coupled to the other component or intervening components may be present. In contrast, when a component is referred to as being "directly connected" or "directly coupled" to another component, there are no intervening elements present.

The terminology used herein is for the purpose of describing particular embodiments only and is not intended to be limiting of example embodiments of the invention. As used herein, the singular forms "a" "an" and "the" are intended to include the plural forms as well, unless the context clearly indicates otherwise. It will be further understood that the terms "comprises", "comprising" "includes" and/or "including" when used herein, specify the presence of stated features, integers, steps, operations, elements, and/or components, but do not preclude the presence or addition of one or more other features, integers, steps, operations, elements, components, and/or groups thereof.

Example embodiments of the present invention will now be described more fully hereinafter with reference to the accompanying drawings. This invention may, however, be embodied in different forms and should not be construed as limited to the embodiments set forth herein. Rather, these example embodiments are provided so that this disclosure will be thorough and complete, and will fully convey the scope of the invention to those skilled in the art. Like numbers refer to like elements throughout the specification.

Figure 2:
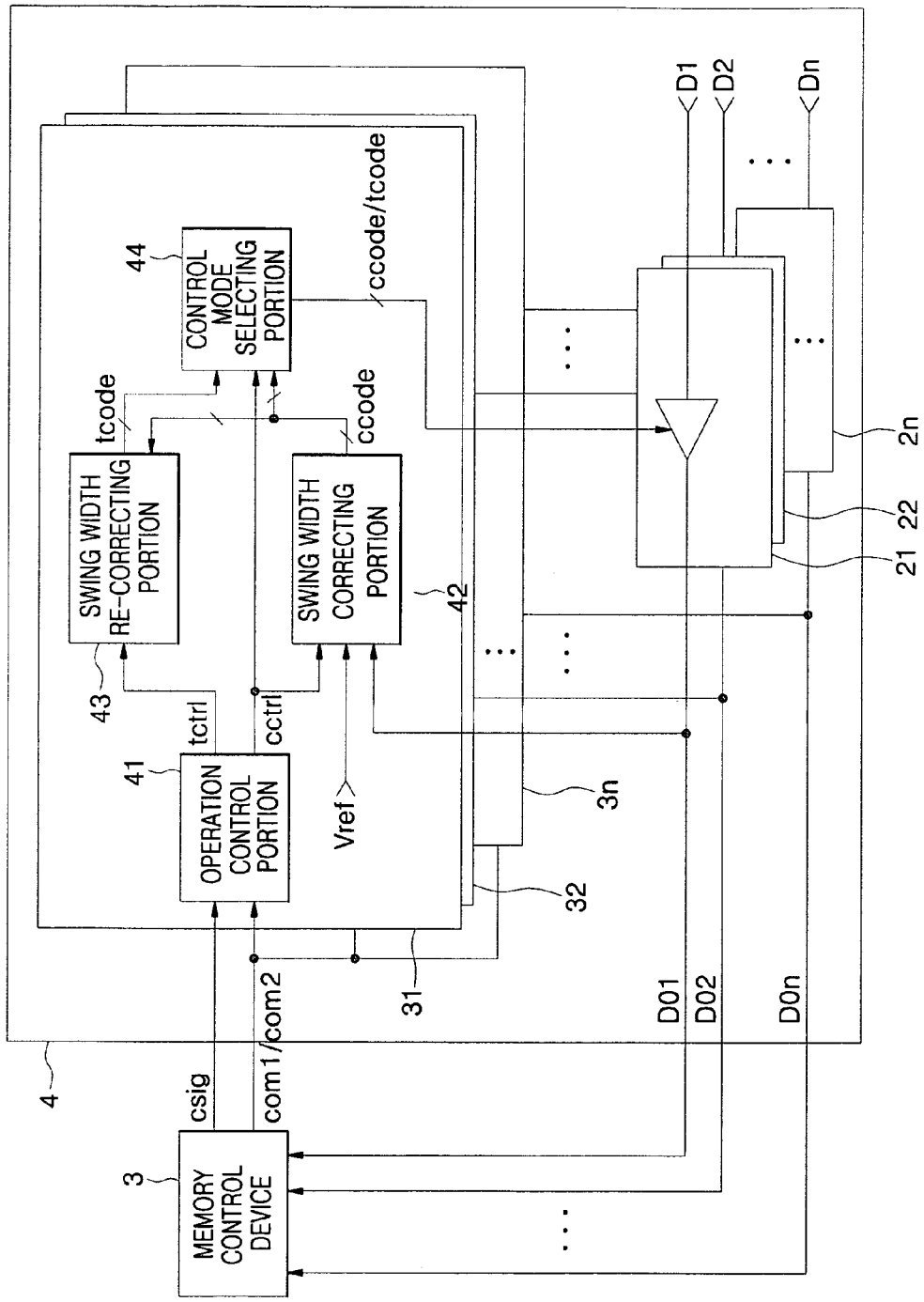
FIG. 2 is a block diagram illustrating a configuration of a memory system according to an example embodiment of the present invention.

FIG. 2 is a block diagram illustrating an example configuration of a memory system according to an example embodiment of the present invention.

Referring to FIG. 2, a memory system may include a memory control device 3 and a semiconductor memory device 4. The semiconductor memory device 4 may include a plurality of output drivers 21 to 2n and a plurality of data swing width controllers 31 to 3n. Each of the data swing width controllers 31 to 3n may include an operation control portion 41, a swing width correcting portion 42, a swing width re-correcting portion 43, and a control mode selecting portion 44. Further, each data swing width controller 31 to 3n may correspond to one of the output drivers 21 to 2n.

Example functions and/or operations of the components shown in FIG. 2 are explained below.

The memory control device 3 may be arranged outside the semiconductor memory device 4 and may control an operation of the semiconductor memory device 4 like a chip set. The memory control device 3 may apply a first command com1 to request a swing width correcting operation and may apply a second command com2 to request a swing width re-correcting operation. For example, the second command com2 may be applied if a predetermined time lapses after the first command com1 is applied during a data swing width control operation. If the second command com2 is applied, the memory control device 3 may continuously receive and analyze data D01 to D0n from the output buffers 21 to 2n of the semiconductor memory device 4 to detect whether an error occurs or not, may generate a complete signal csig based on the detection result and may supply the complete signal csig to the semiconductor memory device 4.

The plurality of data swing width controllers 31 to 3n of the semiconductor memory device 4 may correct and/or change the data swing widths of the plurality of output drivers 21 to 2n so the data swing widths match the correction swing width cswing and may reduce the data swing widths again so that each output data can be normally transmitted to the memory control device 3. Normally transmitted may refer the data swing width being acceptable for the memory control device 3 and/or indicate that data D01 to D0n outputted from the output drivers 21 to 20n is received correctly. That is, the semiconductor memory device 4 corrects and/or changes the data swing widths of each of the plurality of output drivers 21 to 2n by considering the operation environment of the semiconductor memory device, the operating semiconductor memory device of the memory system, and the memory system.

The operation control portion 41 may control operations of the swing width correcting portion 42 and the swing width re-correcting portion 43 in response to the first command signal com1, the second command signal com2, and/or the complete signal csig, each of which may be transmitted from the memory control device 3. For example, the operation control portion 41 generates the swing width correcting signal cctrl to perform the swing width correcting operation when the first command com1 is received, generates a swing width re-correcting signal tctrl to perform the swing width re-correcting operation when the second command com2 is received, and terminates a generation of the swing width re-correcting signal tctrl to complete the swing width correcting and re-correcting operations when the complete signal csig is received.

The swing width correcting portion 42 may perform the swing width correcting operation in response to the swing width correcting signal cctrl. For example, if the swing width correcting signal cctrl is enabled, the swing width correcting portion 42 may receive the data D01 of the corresponding output driver 21, compare the voltage level of the data D01 to the reference voltage Vref and sequentially vary the code value of the correction code ccode, based on the comparison result, to cause the data swing width of the output driver 21 to become equal to the correction swing width cswing.

The swing width re-correcting portion 43 may perform the swing width re-correcting operation in response to the swing width re-correcting signal tctrl. For example, the swing width re-correcting portion 43 may receive the correction code ccode outputted from the swing width correcting portion 42 during the swing width correcting operation and set the correction code ccode outputted form the swing width correcting portion 42 as a re-correction code tcode. The swing width re-correction portion 43 may then sequentially vary the code value of the re-correction code tcode to reduce the data swing width of the corresponding output driver 21 during the swing width re-correcting operation. The swing width re-correction portion 43 may then add the re-correction code tcode having a reduced code value to a margin code and output the added together reduced code value and margin code to the corresponding output driver 21 when the swing width re-correcting operation is completed. As a result, the data swing width of the output driver 21 may be increased again by an amount, which can be normally transmitted to the memory control device 3 based on the code value of the margin code.

The control mode selecting portion 44 may select a type of a control code to be transmitted to the corresponding output driver 21 in response to the swing width correcting signal cctrl. For example, the control mode selecting portion 44 transmits the correction code ccode of the swing width correcting portion 42 to the corresponding output driver 21 when the swing width correcting signal cctrl is enabled during the swing width correcting operation and transmits the re-correction code tcode of the swing width re-correcting portion 43 to the corresponding output driver 21 when the swing width correcting signal cctrl is disabled during the swing width re-correcting operation.

Each of the plurality of output drivers 21 to 2n may vary the data swing width in response to the correction swing code ccode transmitted from a corresponding data swing width controller 31 to 3n and may then transmit the data D01 to D0n having the varied swing width to the swing width correcting portion 42 in the corresponding data swing width controller 31 to 3n during the swing width correcting operation.

Each of the plurality of output drivers 21 to 2n may also vary the data swing width in response to the re-correction code tcode transmitted from the corresponding data swing width controller 31 to 3n, output the data D01 to D0n having the varied swing width to the memory control device 3 during the swing width re-correcting operation, and may set "a minimum swing width mswing" in response to the re-correction code tcode when the swing width re-correction operation is completed. It is noted that the "minimum swing width mswing" may refer to a desired swing width in light of the operating conditions and/or operating environment of the memory device and/or memory system.

According to an example embodiment of the present invention, the minimum swing width mswing and may represent a data swing width, wherein the data of the output driver 21 is normally transmitted to the memory control device 3 without any error under the operation environment of the semiconductor memory device, the operating semiconductor memory device of the memory system and the memory system.

An example operation of the memory system of FIG. 2 is explained below.

According to an example embodiment of the present invention, the plurality of data swing width controllers 31 to 3n and the plurality of output drivers 21 to 2n operate in the same way and thus, example operations of only one data swing width controller 31 and one output driver 21 will be explained below for convenience and brevity.

In the example operation, if the memory control device 3 generates the first command com1 to request the swing width correction operation, the operation control portion 41 enables the swing width correcting signal cctrl. Accordingly, the swing width correcting portion 42 is enabled and the control mode selecting portion 44 transmits the correction code ccode of the swing width correcting portion 42 to the output driver 21.

If a data D01 having a higher voltage level than the reference voltage Vref is received, the swing width correcting portion 42 determines the data swing width of the output driver 21 is smaller than the correction swing width cswing and then varies, for example, increases the code value of the correction code ccode by one interval and/or step, for example. The control mode selecting portion 44 provides the varied correction code ccode to the corresponding output driver 21 to increase the data swing width.

Figure 3:
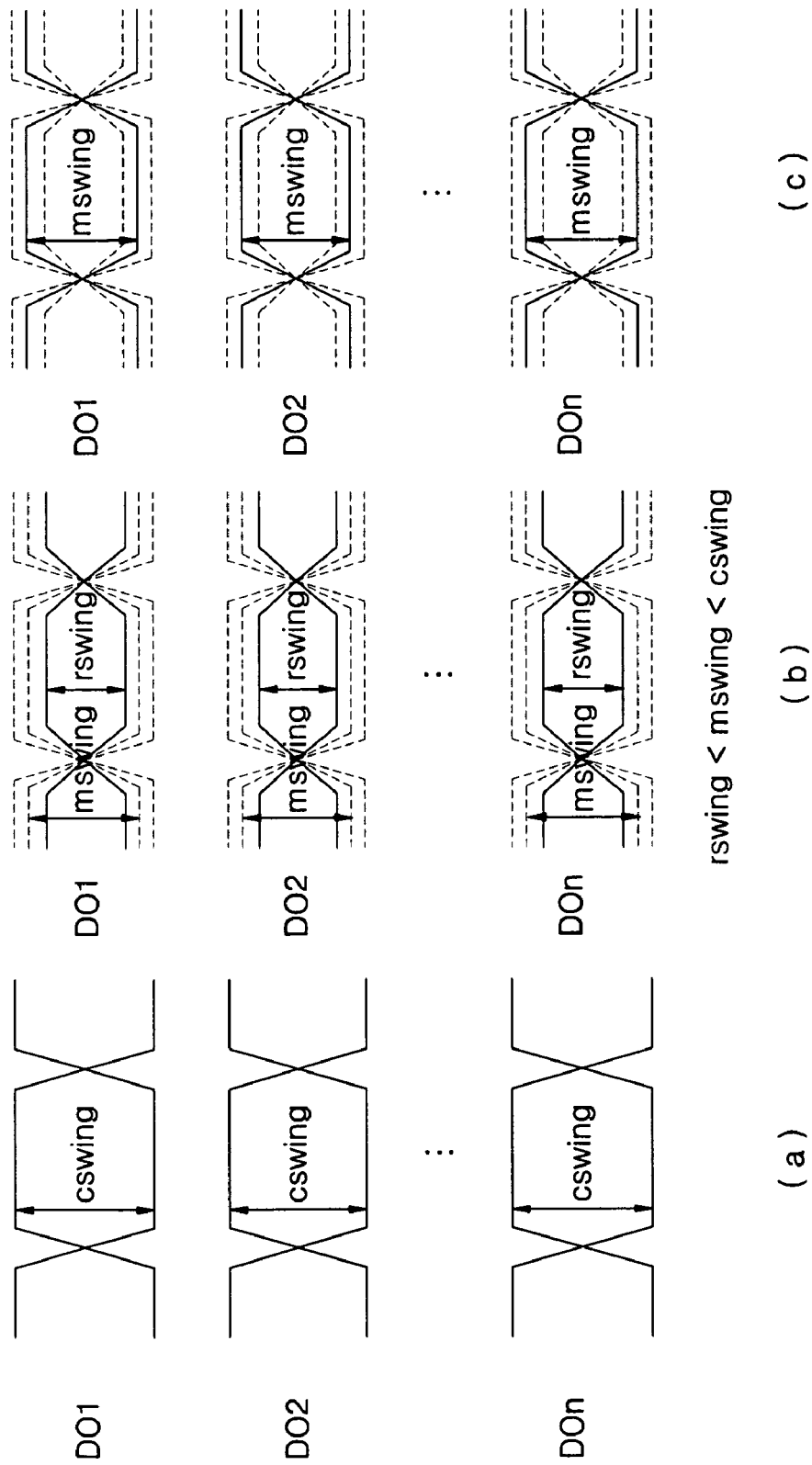
FIG. 3 shows example data swing widths which are set by a swing width correcting operation and a swing width re-correcting operation according to an example embodiment of the present invention.

The swing width correcting portion 42 may repetitively perform the above-described example operation until the voltage level of the data D01 is equal to the reference voltage Vref, as shown in FIG. 3(a), to thereby cause the data swing width of the data D01 of the output driver 21 to become equal to the correction swing width cswing.

On the other hand in this example, if the voltage level of the data D01 has a lower voltage level than the reference voltage Vref, the swing width correcting portion 42 varies, for example, decreases, the code voltage of the correction code ccode to thereby cause the swing width of the data D01 of the output driver 21 to become equal to the correction swing width cswing.

In a state where the swing width of the data D01 of the output driver 21 is corrected to match the correction swing width cswing, when the memory control device 3 generates the second command com2 to request the swing width re-correction operation, the operation control portion 41 generates the swing width re-correction signal tctrl to enable an operation of the swing width re-correcting portion 43, and the control mode selecting portion 44 outputs the re-correction code tcode of the swing width re-correcting portion 43 to the output driver 21.

In the example operation, the swing width re-correcting portion 43 decreases the code value of the re-correction code tcode by one interval and/or step. The control mode selecting portion 44 provides the re-correction code tcode to the output driver 21, and the output driver 21 outputs the data D01 having the decreased swing width to the memory control device 3.

The memory control device 3 may analyze the received data transmitted from the output driver 21 and determine whether the received data has an error or not.

If the received data does not have the error, the memory control device 3 does not generate the complete signal csig. In this example operation, the operation control portion 41 recognizes the lack of a generated complete signal csig as indicating the data swing width is greater than the minimum swing width mswing and may maintain the enable state of the swing width re-correcting signal tctrl to cause the swing width re-correcting portion 43 to continue decreasing the data swing width of the output driver 21.

On the other hand, if the received data has the error, the memory control device 3 generates the complete signal csig to terminate the swing width re-correcting operation.

In this example operation, the operation control portion 41 recognizes the generation of the complete signal csig as indicating the data swing width rswing is smaller than the minimum swing width mswing as in FIG. 3(b) and disables the swing width re-correction signal tctrl to cause the swing width re-correcting portion 43 to complete the swing width re-correcting operation. Accordingly, there is a threshold swing width based on operating conditions and/or environmental conditions of the semiconductor memory device 4, wherein once the data swing width becomes smaller than the threshold swing width the output drivers 21 to 2n are no longer able to normally transmit the data D01 to D0n to the memory control device 3. In other words, once the data swing width becomes smaller than the threshold swing width the data D01 to D0n is either not transmitted to the memory control device and/or the memory control device does not receive the data D01 to D0n correctly.

To complete the swing width re-correcting operation, the swing width re-correcting portion 43 adds the code value of a margin code to the re-correction code tcode obtained by the last swing width re-correcting operation to generate the re-correction code tcode, and the output driver 21 increases the data swing width rswing, which was reduced during the last swing width re-correcting operation as shown in FIG. 3(b), by a desired and/or predetermined amount as shown in FIG. 3(c). That is, the data swing width controller 31 sets the data swing width of the output driver 21 to the minimum swing width mswing and completes the swing width re-correcting operation.

As described above, the semiconductor memory device of FIG. 2 may set the data swing widths of the plurality of output drivers 21 to 2n using the plurality of data swing width controllers 31 to 3n corresponding to the plurality of output drivers 21 to 2n, respectively, by considering the operation environment of the semiconductor memory device, the operating semiconductor memory device of the memory device, and the memory system.

Figure 4:
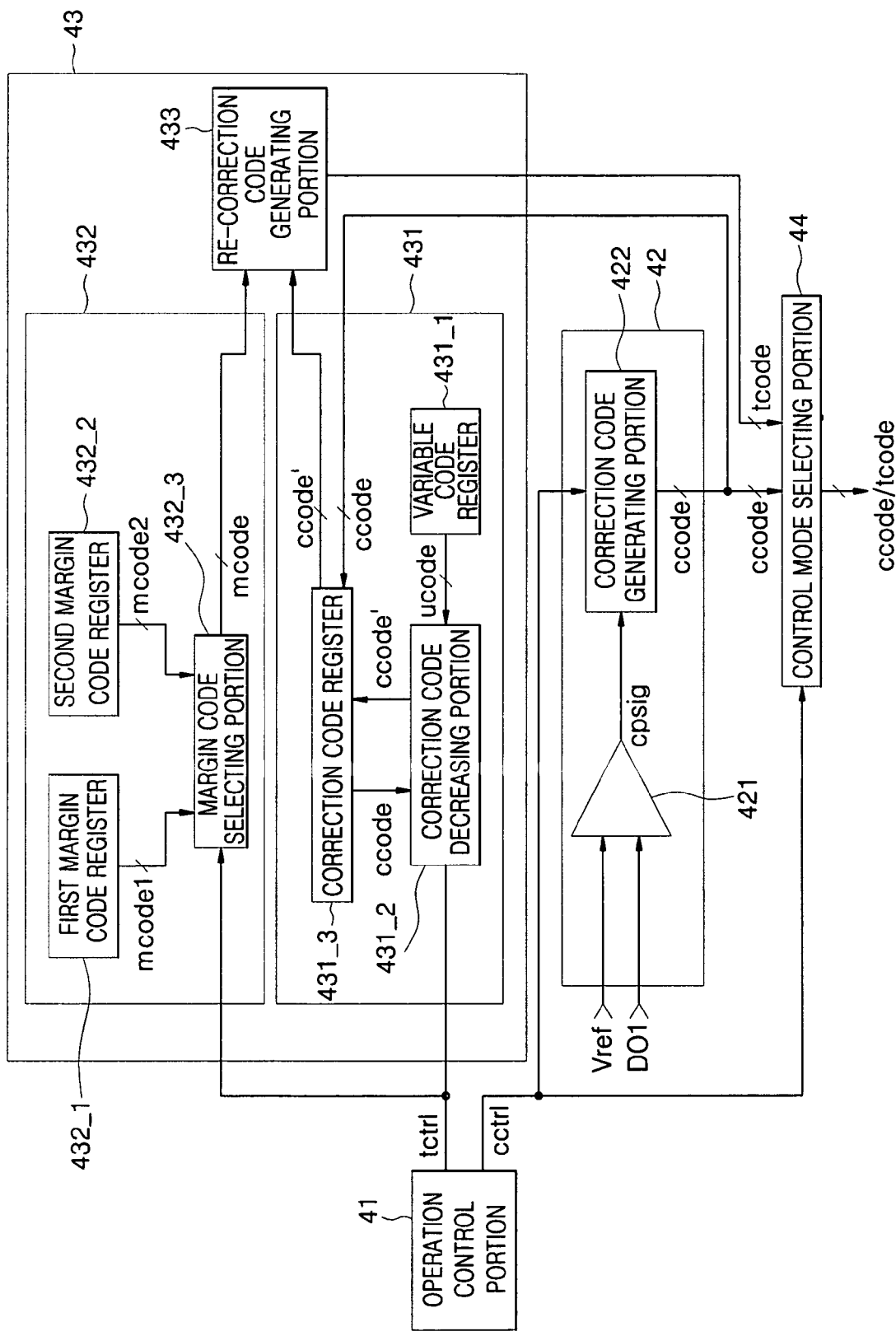
FIG. 4 is a block diagram illustrating a swing width correcting portion and a swing width re-correcting portion arranged in a data swing width controller according to an example embodiment of the present invention.

FIG. 4 is a block diagram illustrating the swing width correcting portion 42 and the swing width re-correcting portion 43 arranged in the data swing width controller 31 according to an example embodiment of the present invention.

Referring to FIG. 4, the swing width correcting portion 42 may include a comparator 421 and a correction code generating portion 422. The swing width re-correcting portion 43 may include a re-correcting code generating section 431, a margin code generating portion 432 and a re-correction code generating portion 433.

The comparator 421 may compare the data of the corresponding output driver 21 to the reference voltage Vref and may generate the comparison signal cpsig based on the comparison result. The correction code generating portion 422 may vary the code value of the correction code ccode according to a logic state of the comparison signal cpsig, may generate the correction code ccode for correcting the data swing width of the corresponding output driver 21 to match the correction swing width cswing and may output the correction code ccode to the control mode selecting portion 44.

The re-correction code generating section 431 may include a variable register 431_1, a correction code decreasing portion 431_2 and a correction code register 431_3. The variable register 431_1 may store a variable code ucode having a code value which determines a variation unit (for example, decrement unit) of the re-correction code tcode. The correction code decreasing portion 431_2 may decrease the code value of the correction code ccode stored in the correction code register 431_3 according to the variable code ucode and may output the correction code ccode' having the decreased code value if the swing width re-correction signal tctrl is enabled. The correction code register 431_3 may store the correction code ccode outputted from the swing width correcting portion 42 if the swing width re-correction signal tctrl is disabled and may store the correction code ccode' outputted from the correction code decreasing portion 431_2 if the swing width re-correction signal tctrl is enabled. The re-correction code generating portion 431 may cause the code value of the correction code to be decreased again during the swing width re-correction operation.

According to an example embodiment of the present invention, the code value of the variable code ucode stored in the variable code register 431_1 may be set by a user.

The margin code generating portion 432 may include a first margin code register 432_1, a second margin code register 432_2, and a margin code selecting portion 432_3. The first margin code register 432_1 may store a first margin code mcode having a code value of "0". The second margin code register 432_2 may store a second margin code mcode2 having a value greater than "0". The margin code selecting portion 432_3 may select and output the first margin code mcode when the swing width re-correction signal tctrl is enabled and may select and output the second margin code mcode2 when the swing width re-correction signal tctrl is disabled. Accordingly, the margin code selecting portion 432_3 may cause the code value of the re-correction code tcode to be increased by the code value of the second margin code mcode2 if the swing width re-correction operation is completed.

According to an example embodiment of the present invention, the code value of the second margin code mcode2 may be set by a user.

The re-correction code generating portion 433 may add the correction code ccode' outputted from the correction code decreasing portion 431_2 to the margin code mcode1/mcode2 outputted from the margin code generating portion 432 to generate the re-correction code tcode and may then transmit the re-correction code tcode to the control mode selecting portion 44. That is, the re-correction code generating portion 433 may generate the re-correction code tcode, which has the code value of the correction code ccode' "as is" during the swing width re-correcting operation and may generate the re-correction code tcode, which is the code value of the correction code ccode' increased by the code value of the second margin code mcode2 when the swing width re-correcting operation is completed.

An example operation of the data swing width controller 31 according to an example embodiment of the present invention will be explained below with reference to FIG. 4.

In this example operation, if the operation control portion 41 enables the swing width correction signal cctrl in response to the first command com1, the correction code generating portion 422 is enabled. Accordingly, the control mode selecting portion 44 becomes a state for selecting the correction code ccode transmitted from the correction code generating portion 422 and outputting the correction code ccode to the output driver 21.

In this state, the comparator 421 receives the data D01 transmitted from the output driver 21 and compares the data D01 to the reference voltage Vref to generate the comparison signal cpsig. The correction code generating portion 422 varies, for example, sequentially increases or decreases, the code value of the correction code ccode of the corresponding output driver 21 in response to the comparison signal cpsig.

The control mode selecting portion 44 provides the correction code ccode of the correction code generating portion 422 to the output driver 21 to cause the data swing width of the output driver 21 to become equal to the correction swing width cswing, as shown in FIG. 3(a).

For example, if the data swing width of the output driver 21 is smaller than the correction swing width cswing, the data swing width of the output driver 21 sequentially increases step by step, for example, until the data swing width of the output driver 21 is equal to the correction swing width cswing.

Conversely, if the data swing width of the output driver 21 is greater than the correction swing width, the data swing width of the output driver 21 sequentially decreases step by step, for example, the data swing width until the data swing width of the output driver 21 is equal to the correction swing width cswing.

Next, in this example operation, if the operation control portion 41 enables the swing width re-correction signal tctrl in response to the second command com2, the correction code decreasing portion 431_2 is enabled, the margin code selecting portion 432_3 outputs the first margin code mcode1 of the first margin code register 432_1, and the control mode selecting portion 44 becomes a state for outputting the re-correction code tcode. The correction code decreasing portion 431_2 decreases the code value of the correction code ccode stored in the correction code register 431_3 by the code value of the variable code ucode to generate the code value of the correction code ccode', and the margin code selecting portion 432_3 outputs the first margin code mcode having the code value of "0".

The re-correction code generating portion 433 generates the re-correction code tcode which has the decreased code value of the correction code ccode', and the control mode selecting portion 44 outputs the re-correction code tcode to the output driver 21 to decrease the data swing width.

The swing width re-correcting portion 43 may repetitively perform the above operation until the data swing width rswing decreases to a level below the data swing width mswing as shown in FIG. 3(b).

If the data swing width rswing is smaller than mswing as shown in FIG. 3(b), the operation control portion 41 disables the swing width re-correction signal tctrl based on the complete signal csig.

In this example, the correction code decreasing portion 431_2 completes the decreasing operation to maintain the code value of the correction code ccode' decreased by the last swing width re-correcting operation. The margin code selecting portion 432_3 outputs the second margin code mcode2 of the second margin code register 432_2.

The re-correction code generating portion 433 generates the re-correction code tcode, which is the code value ccode' increased by the code value of the second margin code mcode2. The control mode selecting portion 44 outputs the re-correction code tcode to the output driver 21.

The output driver 21 increases the decreased data swing width rswing of FIG. 3(b) to the data swing width mswing of FIG. 3(c) so that the memory control device 3 can normally receive the data.

As described above, the swing width correcting portion 42 and the swing width re-correcting portion 43 of FIG. 4 reduce and/or minimize the data swing width of each of the plurality of data swing width controllers 31 to 3n to the extent that the data can be normally transmitted to the memory control device 3.

Figure 5:
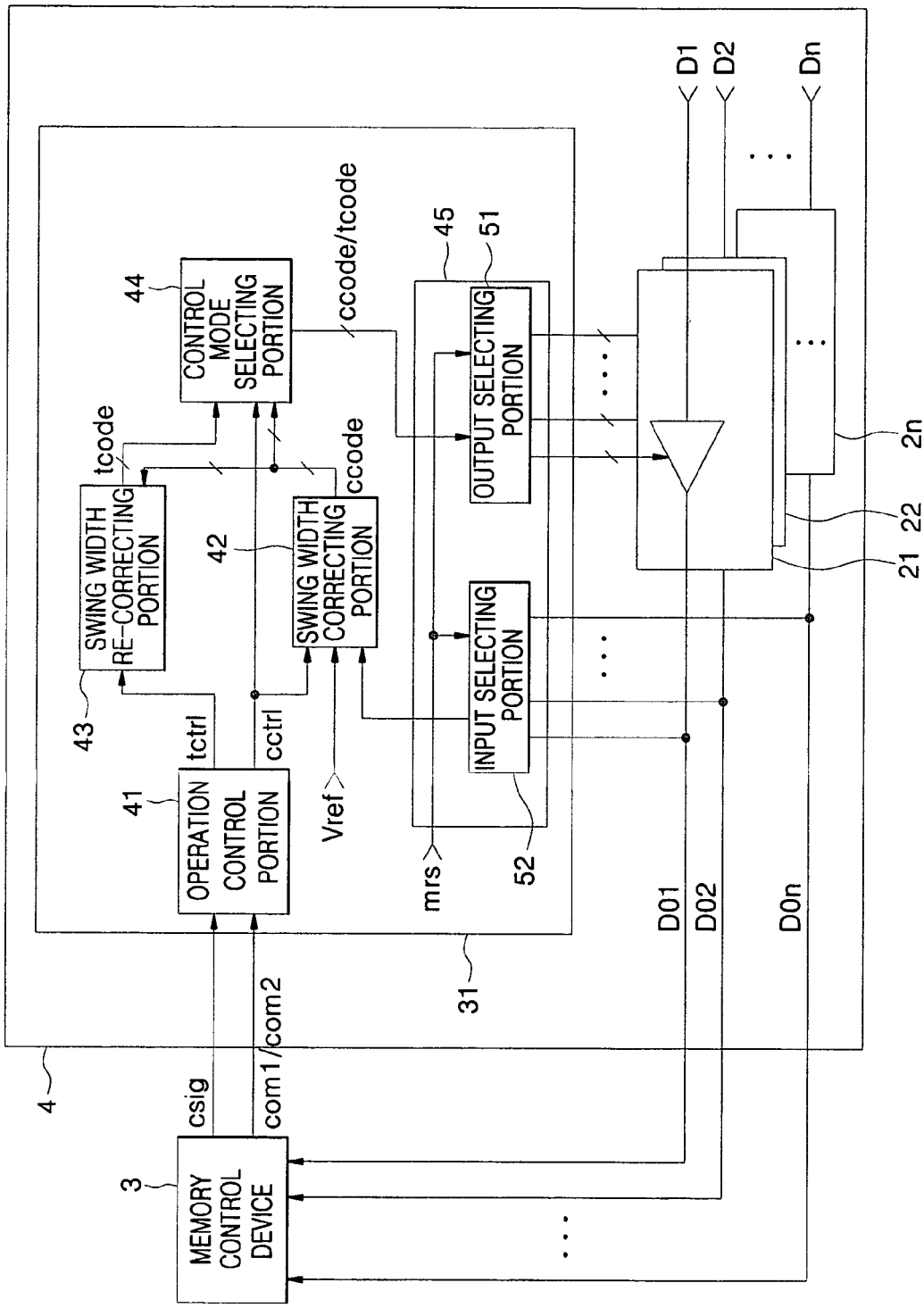
FIG. 5 is a block diagram illustrating a memory system according to an embodiment of the present invention.

FIG. 5 is a block diagram illustrating a memory system according to another example embodiment of the present invention.

Referring to FIG. 5, a memory system may include a memory control device 3 and a semiconductor memory device 4'. The semiconductor memory device 4' may include a plurality of output drivers 21 to 2n, one data swing width controller 31', and a correction driver selecting portion 45. The data swing width controller 31' may also include a correction driver selecting portion 45 in addition to the operation control portion 41, the swing width correcting portion 42, the swing width re-correcting portion 43, and the control mode selecting portion 44 of FIG. 4.

Like reference numerals of FIGS. 2 and 5 denote like parts and perform like operations, and thus a detailed description on the like parts and operations are omitted for the sake of brevity.

The correcting driver selecting portion 45 may include an output selecting portion 51 and an input selecting portion 52, and may select one output driver 21 of the plurality of output drivers 21 to 2n which is to perform the swing width correcting operation in response to a mode setting signal mrs.

The output selecting portion 51 may select one output driver 21 which is to perform the swing width control operation among a plurality of output drivers 21 to 2n in response to the mode setting signal mrs, and may output the correction code ccode or the re-correction code tcode transmitted from the data swing width controller 31 to the selected output driver 21.

The input selecting portion 52 may select one output driver 21 which is to perform the swing width control operation among the plurality of output drivers 21 to 2n in response to the mode setting signal mrs, and may output only the data D01 transmitted from the selected output driver 21 to the data swing width controller 31.

According to an example embodiment of the present invention, the mode setting signal mrs may have information for selecting one output driver which is to perform the swing width control operation and may be a signal generated by a control circuit which may change various operation modes and/or setting values in response to command signals applied from an external portion such as a mode setting register (not shown).

According to an example embodiment of the present invention, the correction driver selecting portion 45 selects one output driver 21 in response to the mode setting signal mrs. However, a driver selecting portion may be configured to select two or more output drivers 21 to 2m (m is a natural number which is smaller than or equal to n) if desired and/or needed.

The semiconductor memory device 4' of FIG. 5 may correct the data swing width of each of the plurality of output drivers 21 to 2n using one data swing width controller 31 according to the operation environment of the semiconductor memory device, the operating semiconductor memory device of the memory system and the memory system.

The variation of the data swing width of the output driver may be performed using a digital code of a predetermined bit, for example, the correction code ccode or the re-correction code tcode, but the variation of the data swing width of the output driver may be performed using a signal having a desired or predetermined voltage or current amount.

As described above, the semiconductor memory device, the memory system having the same, and the swing width control method thereof according to example embodiments of the present invention may reduce and/or minimize the data swing width of the semiconductor memory device to the extent that the data transmission can be normally performed with considering the operation environment of the semiconductor memory device, the operating semiconductor memory device of the memory device, and the memory system. As a result, unnecessary power consumption of the semiconductor memory device may be reduced and/or minimized according to example embodiments of the present invention. Further, according to example embodiments of the present invention, the SSN phenomenon may be reduced and/or minimized while improving the operation performance of the memory system.

Further, because the swing width correction operation for each of a plurality of output drivers is independently performed, the data swing width may be obtained which is suitable for the operation environment of the semiconductor memory device, the operating semiconductor memory device of the memory device, and the memory system according to an example embodiment of the present invention. Thus, the performance of a memory system according to example embodiments of the present invention may be stably maintained.

What is claimed is:

1. A semiconductor memory device, comprising:
   a plurality of output drivers, each of the plurality of output drivers varying a data swing width in response to a correction code; and
   at least one data swing width control portion varying the correction code according to a data swing width of at least one output driver of the plurality of output drivers to change the data swing width to a correction swing width and varying the correction code again to the extent that data of the corresponding output driver are normally transmitted to thereby reduce the data swing width.

2. The semiconductor memory device of claim 1, wherein the at least one data swing width control portion is a plurality of data swing width control portions and each of the plurality of data swing width control portions corresponds to one output driver of the plurality of output drivers, varies the correction code according to a data swing width of the corresponding one output driver to change the data swing width to the correction swing width, and then varies the correction code again to the extent that data of the corresponding output driver are normally transmitted to thereby reduce the data swing width.

3. The semiconductor memory device of claim 2, wherein each of the plurality of data swing width control portions includes
   an operation control portion controlling a swing width correction operation and a swing width re-correction operation until data of the corresponding output driver are not transmitted when the swing width correction operation is completed;
   a swing width correcting portion comparing the data swing width of the corresponding one output driver to the correction swing width and varying the correction code, based on a comparison result, to change the data swing width to the correction swing width during the swing width operation; and
   a swing width re-correcting portion varying the correction code resulting from the swing width correcting portion to decrease the data swing width during the swing width re-correction operation and then increasing the correction code again for the data of the corresponding output driver to be normally transmitted to thereby increase the data swing width again when the swing width re-correction operation is completed.

4. The semiconductor memory device of claim 3, wherein the swing width re-correcting portion includes
   a correction code varying portion storing the correction code varied by the swing width correcting portion during the swing width correction operation and decreasing the stored correction code during the swing width re-correction operation;
   a margin code generating portion generating a margin code having a code value for varying the correction code when the swing width re-correction operation is completed; and
   a re-correction code generating portion adding the margin code to the correction code of the correction code varying portion and outputting the addition result to the corresponding one output driver.

5. The semiconductor memory device of claim 4, wherein the margin code generating portion includes
   a first margin code storing portion storing a first margin code having a first value for not varying the correction code;
   a second margin code storing portion storing a second margin code having a second value for varying the correction code; and
   a margin code selecting portion outputting the first margin code during the swing width re-correction operation and outputting the second margin code when the swing width re-correction operation is completed.

6. The semiconductor memory device of claim 4, wherein the correction code varying portion includes
   a variable code storing portion storing a variable code having a code value deciding a variation unit of the correction code;
   a correction code decreasing portion varying the correction code outputted from the swing width correcting portion according to the variable code during the swing width re-correction operation; and
   a correction code storing portion storing the correction code outputted from the swing width correcting portion during the swing width correction operation and storing the correction code outputted from the correction code decreasing portion during the swing width re-correction operation.

7. The semiconductor memory device of claim 2, wherein each of the plurality of data swing width control portions includes a control mode selecting portion outputting the correction code of the swing width correcting portion to the corresponding one output driver during the swing width correction operation and outputting the correction code of the swing width re-correcting portion to the corresponding one output driver during the swing width re-correction operation.

8. A semiconductor memory device, comprising:
   a plurality of output drivers each of which varies a data swing width in response to a correction code; and
   a swing width control portion which selects at least one of the plurality of output drivers according to a driver selecting signal, varies the correction code according to a data swing width of the selected output driver to change the data swing width to a correction swing width, and then varies the correction code again to the extent that data of the selected output driver are normally transmitted to thereby reduce the data swing width.

9. The semiconductor memory device of claim 8, wherein the at least one data swing width control portion includes an operation control portion controlling a swing width correction operation and a swing width re-correction operation until data of the selected output driver are not transmitted when the swing width correction operation is completed;

a swing width correcting portion comparing the data swing width of the selected output driver to the correction swing width and varying the correction code, based on a comparison result, to change the data swing width to the correction swing width during the swing width operation;

a swing width re-correcting portion decreasing the correction code resulting from the swing width correcting portion to decrease the data swing width during the swing width re-correction operation and then increasing the correction code again for the data of the selected output driver to be normally transmitted to thereby increase the data swing width again when the swing width re-correction operation is completed; and a correction driver selecting portion performing at least one of selecting one of the plurality of output drivers according to the driver selecting signal and transmitting the correction code outputted from one of the swing width correcting portion and the swing width re-correcting portion to the selected output driver, and transmitting data outputted from the selected output driver to the swing width correcting portion.

10. The semiconductor memory device of claim 9, wherein the swing width re-correcting portion includes a correction code varying portion storing the correction code varied by the swing width correcting portion during the swing width correction operation and decreasing the stored correction code again during the swing width re-correction operation;

a margin code generating portion generating a margin code having a code value for varying the correction code when the swing width re-correction operation is completed; and a re-correction code generating portion adding the margin code of the margin code generating portion to the correction code of the correction code varying portion and outputting the addition result to the selected output driver.

11. The semiconductor memory device of claim 10, wherein the margin code generating portion includes a first margin code storing portion storing a first margin code having a first value for not varying the correction code;

a second margin code storing portion storing a second margin code having a second value for varying the correction code; and a margin code selecting portion outputting the first margin code during the swing width re-correction operation and outputting the second margin code when the swing width re-correction operation is completed.

12. The semiconductor memory device of claim 10, wherein the correction code varying portion includes a variable code storing portion storing a variable code having a code value deciding a variation unit of the correction code;

a correction code decreasing portion varying the correction code outputted from the swing width correcting portion code outputted from the swing width correcting portion according to the variable code during the swing width re-correction operation; and a correction code storing portion storing the correction code outputted from the swing width correcting portion during the swing width correction operation and storing the correction code outputted from the correction code decreasing portion during the swing width re-correction operation.

13. The semiconductor memory device of claim 9, wherein the correction driver selecting portion includes an output selecting portion selecting at least one of the plurality of output drivers according to the driver selecting signal and one of transmitting the correction code outputted from the swing width correcting portion to the selected output driver and transmitting the swing width re-correcting portion to the selected output driver; and an input selecting portion selecting at least one of the plurality of output drivers according to the driver selecting signal and transmitting data outputted from the selected output driver to the swing width correcting portion.

14. The semiconductor memory device of claim 9, wherein each of the at least one data swing width control portion includes a control mode selecting portion outputting the correction code of the swing width correcting portion to the selected output driver during the swing width correction operation and outputting the correction code of the swing width re-correcting portion to the selected output driver during the swing width re-correction operation.

15. A memory system, comprising:

a control device generating a first command to request a swing width correction operation, then generating a second command to request a swing width re-correction operation, detecting whether there is an error in input data when the second command is generated, and generating a detecting signal;

a plurality of output drivers, each of which vary a data swing width in response to correction codes; and at least one data swing width control portion, each of the at least one data swing width control portion varying the correction codes to change the data swing width of at least one of the output of the plurality of output drivers to a correction swing width in response to the first command, and varying the correction codes again to the extent that data of each of the output drivers are normally transmitted to thereby reduce the data swing width.

16. The memory system of claim 15, wherein the at least one data swing width control portion is a plurality of data swing width control portions and each of the plurality of data swing width control portions corresponds to one of the plurality of output drivers and includes an operation control portion controlling a swing width correction operation in response to the first command and a swing width re-correction operation in response to the second command and determining whether the swing width re-correction operation is completed in response to the detecting signal input during the swing width re-correction operation;

a swing width correcting portion comparing the data swing width of the corresponding output driver to the correction swing width and varying the correction code, based on a comparison result, to change the data swing width to the correction swing width during the swing width operation; and a swing width re-correcting portion varying the correction code resulting from the swing width correcting portion to decrease the data swing width during the swing width re-correction operation and then increasing the correction code again for the data of the corresponding output driver to be normally transmitted to thereby increase the data swing width again when the swing width re-correction operation is completed.

17. The memory system of claim 16, wherein the swing width re-correcting portion includes a correction code varying portion storing the correction code varied by the swing width correcting portion during the swing width correction operation and decreasing the stored correction code again during the swing width re-correction operation;

a margin code generating portion generating a first margin code having a first value during the swing width re-correction operation and generating a second margin code having a second value when the swing width re-correction operation is completed; and a re-correction code generating portion adding the margin code of the margin code generating portion to the correction code of the correction code varying portion and outputting the addition result to the corresponding output driver.

18. The memory system of claim 15, wherein the at least one data swing width control portion includes an operation control portion controlling a swing width correction operation in response to the first command and a swing width re-correction operation in response to the second command and determining whether the swing width re-correction operation is completed in response to the detecting signal inputted during the swing width re-correction operation;

a swing width correcting portion comparing the data swing width of the corresponding output driver to the correction swing width and varying the correction code, based on a comparison result, to change the data swing width to the correction swing width during the swing width operation;

a swing width re-correcting portion varying the correction code resulting from the swing width correcting portion to decrease the data swing width during the swing width re-correction operation and then increasing the correction code again for the data of the corresponding output driver to be normally transmitted to thereby increase the data swing width again when the swing width re-correction operation is completed; and a correction driver selecting portion selecting the corresponding output driver according to a driver selecting signal and one of transmitting the correction code outputted from the swing width correcting portion and the swing width re-correcting portion to the selected output driver and transmitting data outputted from the selected output driver to the swing width correcting portion.

19. The memory system of claim 18, wherein the swing width re-correcting portion includes a correction code varying portion storing the correction code varied by the swing width correcting portion during the swing width correction operation and decreasing the stored correction code during the swing width re-correction operation;

a margin code generating portion generating a margin code having a code value for varying the correction code when the swing width re-correction operation is completed; and a re-correction code generating portion adding the margin code of the margin code generating portion to the correction code of the correction code varying portion and outputting the addition result to the corresponding output driver.

20. A swing width control method of a semiconductor memory device, comprising:

correcting a swing width for comparing a swing width of output data to a correction swing width and varying a correction code based on the comparing so the swing width of the output data is equal to the correction swing width;

re-correcting the swing width for varying the correction code again to the extent that the output data are normally transmitted to reduce the swing width of the output data; and completing of the re-correcting the swing width for adding a margin code to the correction code to increase the swing width of the output data a little and then maintaining the increased swing width of the output data when the output data are abnormally transmitted.

21. The swing width control method of claim 20, wherein the re-correcting the swing width includes obtaining the correction code which is varied in the swing width correcting step;

varying the correction code again to reduce the swing width of the output data and then detecting whether the output data are normally transmitted or not; and reentering the varying the correction code again when the output data are normally transmitted and entering the swing width re-correction completing step when the output data are abnormally transmitted.

22. A semiconductor memory device, comprising:

a plurality of output drivers, each of the plurality of output drivers varying a data swing width in response to a correction code; and at least one data swing width control portion varying the correction code until a data swing width of at least one corresponding output driver of the plurality of output drivers matches a correction swing width, varying the correction code again until the data swing width is smaller than a threshold swing width, adding a margin code to the correction code to create an added code, and supplying the added code to the at least one corresponding output driver.

23. The semiconductor memory device of claim 22, wherein the at least one data swing width control portion includes a swing width correcting portion comparing the data swing width of the at least one corresponding output driver to the correction swing width and varying the correction code to change the data swing width until the data swing width equals the correction swing width; and a swing width re-correction portion further varying the correction code from the swing width correcting portion to decrease the data swing width until the data swing width is smaller than a threshold swing width and adding the correction code to a margin code to increase the data swing width.

24. The semiconductor memory device of claim 22, wherein the threshold swing width is based on operating conditions of the semiconductor memory device.

25. A swing width control method of a semiconductor memory device, comprising:
   comparing a swing width of output data to a correction swing width;
   varying a correction code based on the comparing so the swing width of the output data is equal to the correction swing width;
   varying the correction code again until the data swing width is smaller than a threshold swing width; and
   adding a margin code to the correction code to increase the swing width of the output data to a value between the correction swing width and the threshold swing width.

* * * * *